US010553393B2

(12) United States Patent
Li et al.

(10) Patent No.: US 10,553,393 B2
(45) Date of Patent: Feb. 4, 2020

(54) LASER-ASSISTED ELECTRON-BEAM INSPECTION FOR SEMICONDUCTOR DEVICES

(71) Applicant: Zhongke Jingyuan Electron Limited, Beijing (CN)

(72) Inventors: Shiguang Li, Beijing (CN); Jie Guo, Beijing (CN); Mingcheng Zong, Beijing (CN)

(73) Assignee: Zhongke Jingyuan Electron Limited, Beijing (CN)

( * ) Notice: Subject to any disclaimer, the term of this patent is extended or adjusted under 35 U.S.C. 154(b) by 0 days.

(21) Appl. No.: 16/113,829

(22) Filed: Aug. 27, 2018

(65) Prior Publication Data
US 2019/0333733 A1    Oct. 31, 2019

(30) Foreign Application Priority Data
Apr. 27, 2018    (CN) .......................... 2018 1 0392501

(51) Int. Cl.
*H01J 37/24*        (2006.01)
*G02B 27/30*        (2006.01)
(Continued)

(52) U.S. Cl.
CPC ............ *H01J 37/226* (2013.01); *G02B 5/122* (2013.01); *G02B 27/0961* (2013.01);
(Continued)

(58) Field of Classification Search
CPC .. H01J 37/28; H01J 37/244; H01J 2237/2482; H01J 2237/004;
(Continued)

(56) References Cited

U.S. PATENT DOCUMENTS 3,831,030 A * 8/1974 Wrobel .................. G01N 21/39
                                                          250/339.13
4,902,967 A * 2/1990 Flesner ................ G01R 31/305
                                                           250/492.2
(Continued)

OTHER PUBLICATIONS

Optical Beam Enhanced Defect Detection With Electron Beam Inspection Tools Yan Zhao, Long Ma, Fei Wang, Jessica Hsiao, Hong Xiao, Jack Jau.
(Continued)

*Primary Examiner* — David A Vanore
(74) *Attorney, Agent, or Firm* — Young Basile Hanlon & MacFarlane, P.C.

(57) ABSTRACT

Methods and apparatuses for laser-assisted electron-beam inspection (EBI) are provided. The apparatus includes an EBI device and a laser illumination device. The EBI device includes an e-beam source configured to emit an incident e-beam, a deflector configured to deflect the incident e-beam to be projected onto a surface of a semiconductor device, and an electron detector configured to detect emergent electrons generated by the incident e-beam projected onto the surface. The laser illumination device includes a laser source configured to generate a laser, and a guiding device configured to guide the laser to be projected onto the semiconductor device. The laser changes the emergent electrons to cause, in a positive mode of the EBI apparatus, a PN junction of an NMOS of the semiconductor device to be in a conduction state.

17 Claims, 3 Drawing Sheets

(51) Int. Cl.
*H01J 37/22* (2006.01)
*G02B 5/122* (2006.01)
*G02B 27/09* (2006.01)
*H01J 37/147* (2006.01)
*H01J 37/244* (2006.01)
*H01J 37/26* (2006.01)
*H01L 27/092* (2006.01)

(52) U.S. Cl.
CPC ......... *G02B 27/0966* (2013.01); *G02B 27/30* (2013.01); *H01J 37/147* (2013.01); *H01J 37/244* (2013.01); *H01J 37/265* (2013.01); *H01J 2237/2448* (2013.01); *H01J 2237/24475* (2013.01); *H01J 2237/24592* (2013.01); *H01L 27/0924* (2013.01)

(58) Field of Classification Search
CPC ......... H01J 2237/0047; H01J 2237/206; H01J 2237/0048; H01J 2237/063; H01J 2237/06333; H01J 2237/1205; H01J 2237/2803; H01J 2237/2806; H01J 37/05; H01J 37/21; H01J 37/226; G01N 2201/0612; G01N 2021/6421; G01N 2021/8845; G01N 2201/06113; G01N 2201/067
USPC .......... 250/310, 306, 307, 311, 492.2, 341.4, 250/552; 324/724.22, 754.22, 754.23, 324/762.01; 356/317, 318, 417; 850/9, 850/62
See application file for complete search history.

(56) References Cited

U.S. PATENT DOCUMENTS

| | | | | |
|---|---|---|---|---|
| 4,972,142 | A * | 11/1990 | Brust | G01R 31/305 324/754.22 |
| 5,422,498 | A * | 6/1995 | Nikawa | G01R 31/2853 257/431 |
| 5,872,360 | A * | 2/1999 | Paniccia | G01R 31/311 250/341.4 |
| 6,407,373 | B1 * | 6/2002 | Dotan | G01N 21/9501 250/201.3 |
| 6,720,779 | B1 * | 4/2004 | Lee | G01R 31/305 324/754.22 |
| 7,473,911 | B2 * | 1/2009 | Kadyshevitch | H01J 37/32935 250/492.22 |
| 7,947,953 | B2 * | 5/2011 | Frosien | G01T 1/00 250/309 |
| 8,395,770 | B1 * | 3/2013 | Hug | G01J 3/10 356/317 |
| 8,440,969 | B2 * | 5/2013 | Moore | G02B 21/002 250/307 |
| 8,692,194 | B2 * | 4/2014 | Isozaki | H01J 37/244 250/310 |
| 8,759,760 | B2 * | 6/2014 | Zeidler | H01J 37/09 250/306 |
| 8,896,827 | B2 * | 11/2014 | Chimmalgi | G01N 21/8806 356/237.5 |
| 9,035,249 | B1 * | 5/2015 | Frosien | H01J 37/05 250/310 |
| 9,040,909 | B2 * | 5/2015 | Parker | G01N 21/6428 250/306 |
| 9,244,112 | B2 * | 1/2016 | Liao | H01L 22/12 |
| 9,564,291 | B1 * | 2/2017 | Own | H01J 37/28 |
| 9,568,418 | B1 * | 2/2017 | Hug | G01J 3/10 |
| 10,133,838 | B2 * | 11/2018 | Liu | G06F 17/504 |
| 10,274,537 | B2 * | 4/2019 | Yeh | G01R 31/307 |
| 2003/0058444 | A1 | 3/2003 | Nara et al. | |
| 2004/0065827 | A1 * | 4/2004 | Kienzle | H01J 37/28 250/311 |
| 2008/0296496 | A1 * | 12/2008 | Zhao | G01N 23/225 250/307 |
| 2010/0181492 | A1 * | 7/2010 | Zhao | H01J 37/026 250/396 R |
| 2010/0258722 | A1 * | 10/2010 | Fang | H01J 37/026 250/310 |
| 2011/0036981 | A1 * | 2/2011 | Zhao | G01N 23/2206 250/307 |
| 2016/0343534 | A1 * | 11/2016 | Wang | H01J 37/026 |
| 2018/0254167 | A1 * | 9/2018 | Zhao | H01J 37/1475 |

OTHER PUBLICATIONS

Contact leakage and open monitoring with an advanced e-beam inspection system Shuen-chen Leia, Hermes Liua, Mingsheng Tsaia, Hung-Chi Wub, Hong Xiaoc and Jack Jauc.

Study of Devices Leakage of 45nm node with Different SRAM Layouts Using an Advanced ebeam Inspection Systems Hong Xiao, Long (Eric) Ma, Yan Zhao, and Jack Jau Hermes Microvision, Inc.

* cited by examiner

LASER-ASSISTED ELECTRON-BEAM INSPECTION FOR SEMICONDUCTOR DEVICES

CROSS-REFERENCE TO RELATED APPLICATION(S)

This application claims priority to Chinese Patent Application No. 201810392501.7, filed on Apr. 27, 2018, the content of which is hereby incorporated by reference in its entirety.

TECHNICAL FIELD

This disclosure relates to the field of semiconductor inspection technologies, in particular, to laser-assisted electron-beam (e-beam) inspection of semiconductor devices, and specifically, to apparatuses and methods of e-beam defect inspection of complementary metal-oxide semiconductor (CMOS) integrated circuits (ICs).

BACKGROUND

In recent years, e-beam inspection (EBI) devices have been used for defect detection of chips in the semiconductor industry. For example, the defect detection can include detection of open circuits or short circuits in CMOS (e.g., disconnection between the CMOS and contact holes). A CMOS-type IC can include two basic types of units: an N-type metal-oxide semiconductor (NMOS) and a P-type metal-oxide semiconductor (PMOS).

The EBI device can work in different charging modes (e.g., a positive charging mode or a negative charging mode) for defect detection of the CMOS. However, for defect detection, different types of units of the CMOS can require different charging modes or different bias voltages of the EBI device, which can slow down the EBI process.

SUMMARY

Disclosed herein are implementations of methods, apparatuses, and systems for laser-assisted electron-beam inspection.

In an aspect, an apparatus for laser-assisted electron-beam inspection is disclosed. The apparatus includes an EBI device and a laser illumination device. The EBI device includes an e-beam source configured to emit an incident e-beam, a deflector configured to deflect the incident e-beam to be projected onto a surface of a semiconductor device, and an electron detector configured to detect emergent electrons generated by the incident e-beam projected onto the surface. The laser illumination device includes a laser source configured to generate a laser, and a guiding device configured to guide the laser to be projected onto the semiconductor device. The laser changes the emergent electrons by a photovoltaic effect to cause, in a positive mode of the EBI apparatus, a PN junction of an N-type metal-oxide semiconductor (NMOS) of the semiconductor device to be in a conduction state.

In another aspect, a method for laser-assisted electron-beam inspection is disclosed. The method includes detecting, using an apparatus in a simultaneous manner, whether an open-circuit defect exist in a metal contact hole corresponding to a P-type metal-oxide semiconductor (PMOS) of a semiconductor device or a metal contact hole corresponding to an N-type metal-oxide semiconductor (NMOS) of the semiconductor device. The apparatus comprises an electron detector, and the apparatus further comprises an EBI device that is in a positive mode and a laser illumination device. The EBI device includes an e-beam source configured to emit an incident e-beam, a deflector configured to deflect the incident e-beam to be projected onto a surface of a semiconductor device, and an electron detector configured to detect emergent electrons generated by the incident e-beam projected onto the surface. The laser illumination device includes a laser source configured to generate a laser, and a guiding device configured to guide the laser to be projected onto the semiconductor device. The laser changes the emergent electrons to cause a PN junction of the NMOS to be in a conduction state.

BRIEF DESCRIPTION OF THE DRAWINGS

Implementations of this disclosure will be described, as examples only, with reference to the accompanying drawings. Corresponding reference numerals indicate corresponding parts in the drawings. A brief description of the drawings is as follows.

DETAILED DESCRIPTION

Figure 1:
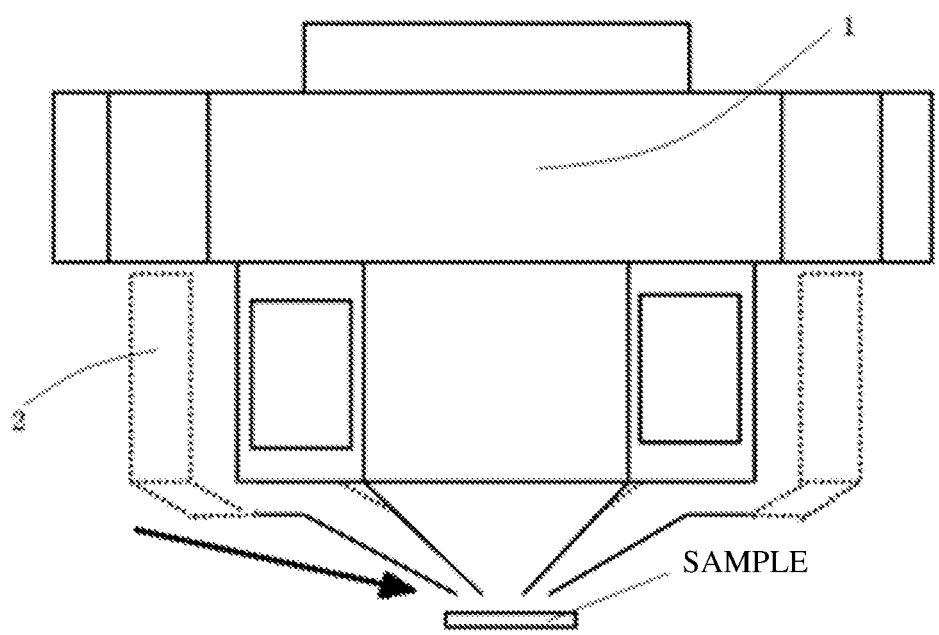
FIG. 1 is a diagram of an example EBI apparatus according to implementations of this disclosure.

The technical solutions of this disclosure will be described in detail by way of examples with reference to the accompanying drawings. In this disclosure, the same or similar reference numerals and letters indicate the same or similar parts. The following description of the implementations of this disclosure is intended to be illustrative and not to be construed as any limitation to this disclosure.

The drawings are used to illustrate the disclosure. The dimensions and shapes of the various components in the drawings do not reflect the true proportions of the components of the laser-assisted e-beam inspection device for semiconductor devices.

The working principles of this disclosure are set forth as below.

For CMOS-type ICs, disconnection between the CMOS and a contact hole is one of the most common defects. Detection of the disconnection between the CMOS and the contact hole can be implemented as follows. An EBI device can be in a positive charging mode (or "positive mode" for simplicity). In the positive mode, an incident e-beam can be projected to a surface (referred to as a "test surface") of a sample (referred to as a "test sample") of a semiconductor device to be inspected, and a ratio (or a "yield") of secondary electrons (i.e., electrons generated as ionization by the incident e-beam) to primary electrons (i.e., electrons of the incident e-beam) is greater than 1. A PN junction of the PMOS can be forward biased (or "in a forward bias state") in the positive mode. Positive charges do not accumulate at a point of a metal contact hole corresponding to the PN junction, so the yield of the secondary electrons can maintain unchanged if there is no defect in the PMOS. When there is an open-circuit defect (e.g., in the PN junction or an electrical path of the PMOS), the positive charges can accumulate to a level that can attract the secondary electrons at the point of the metal contact hole, and further lower the yield of the secondary electrons. As a result, in an inspection image generated by the EBI device, the image region corresponding to the open-circuit defect can be darker than image regions corresponding to portions of the PMOS that have no defect, by which the open-circuit defect can be identified for the PMOS. However, in the positive mode, a PN junction of the NMOS can be reverse biased (or "in a reverse bias state"). In the reverse bias state, no matter whether the NMOS is in contact with a corresponding metal contact hole, the accumulated charges thereon cannot be drained. As a result, based on the inspection image of the metal contact hole corresponding to the NMOS generated by the EBI device, it can be difficult to differentiate an electrically connected metal contact hole and an open-circuit defect thereof, which is easy to cause a misjudgment in defect detection. Therefore, by using the positive mode only, it can be ineffective to differentiate whether an open-circuit defect exist in a metal contact hole corresponding to the NMOS.

On the other hand, when the EBI device is in a negative charging mode (or "negative mode" for simplicity), according to the principles described as above, only the open-circuit defects in the NMOS can be detected. In the negative mode, the yield of the secondary electrons is smaller than 1. The negative mode can be implemented by increasing the energy of a scanning e-beam. The open-circuit defects in the NMOS can be represented in the inspection image as an image region brighter than image regions corresponding to portions of the NMOS that have no defect. However, in the negative mode, it can be ineffective to differentiate whether an open-circuit defect exist in a metal contact hole corresponding to the PMOS.

In addition, if the EBI device applies a strong electric field, the PN junction of the NMOS can be reversely broken down, by which the charge accumulated on the NMOS can be drained. In this situation, it is possible to detect whether an open-circuit defect exist in a metal contact hole corresponding to the NMOS. However, the introduction of the strong electric field can also bring design difficulties and risks of permanent damage to the semiconductor device to be inspected (e.g., the PMOS and/or the NMOS).

In some implementations of this disclosure, an EBI apparatus is in a normal working state (i.e., in which the EBI apparatus is in the positive mode). An additional laser beam is illuminated onto a test sample of the semiconductor device under inspection to induce a photovoltaic effect that can change emergent electrons (e.g., secondary electrons and/or backscattered electrons). Specifically, the photovoltaic effect can modulate the I-V curve of the NMOS, causing an electric potential (that is generated by a charging effect of the illuminated sample) of a surface of the NMOS to drop, and eventually changing the emergent electrons. Thus, via the photovoltaic effect, the laser projected on PN junctions of a CMOS of the semiconductor device can change the emergent electrons, such that, under a normal working state of the EBI apparatus (i.e., the EBI apparatus is in the positive mode), a PN junction of a PMOS of the CMOS of the semiconductor device is in a forward bias status, and a PN junction of an NMOS of the CMOS is in a conduction state due to being short-circuited by the photovoltaic effect. Due to the photovoltaic effect, electric charges accumulated on the NMOS can be drained via a corresponding metal contact hole well connected to the NMOS. Therefore, in a single detection process under the normal working state (in which the EBI is in the positive mode) of the electron detector, it can be simultaneously detected whether an open-circuit defect exists in respective metal contact holes corresponding to the PMOS and the NMOS. In some other implementations, utilization rate of the laser energy can be improved by reducing optical energy loss caused by reflection of the laser beam by the test sample. In some implementations, some practical conditions are further considered, such as spatial limitation caused by limited internal apparatus structures due to positioning a laser source inside the EBI apparatus, an oblique incident angle of the laser beam due to the spatial limitation, variation of a shape of a laser spot projected onto an effective illumination region of the test surface due to the oblique incident angle of the laser beam, or non-uniform distribution of the laser spot due to intrinsic property of a Gaussian distribution of the laser beam. Accordingly, beam shaping is introduced for the laser beam projected onto the effective illumination region of the test surface.

Figure 2:
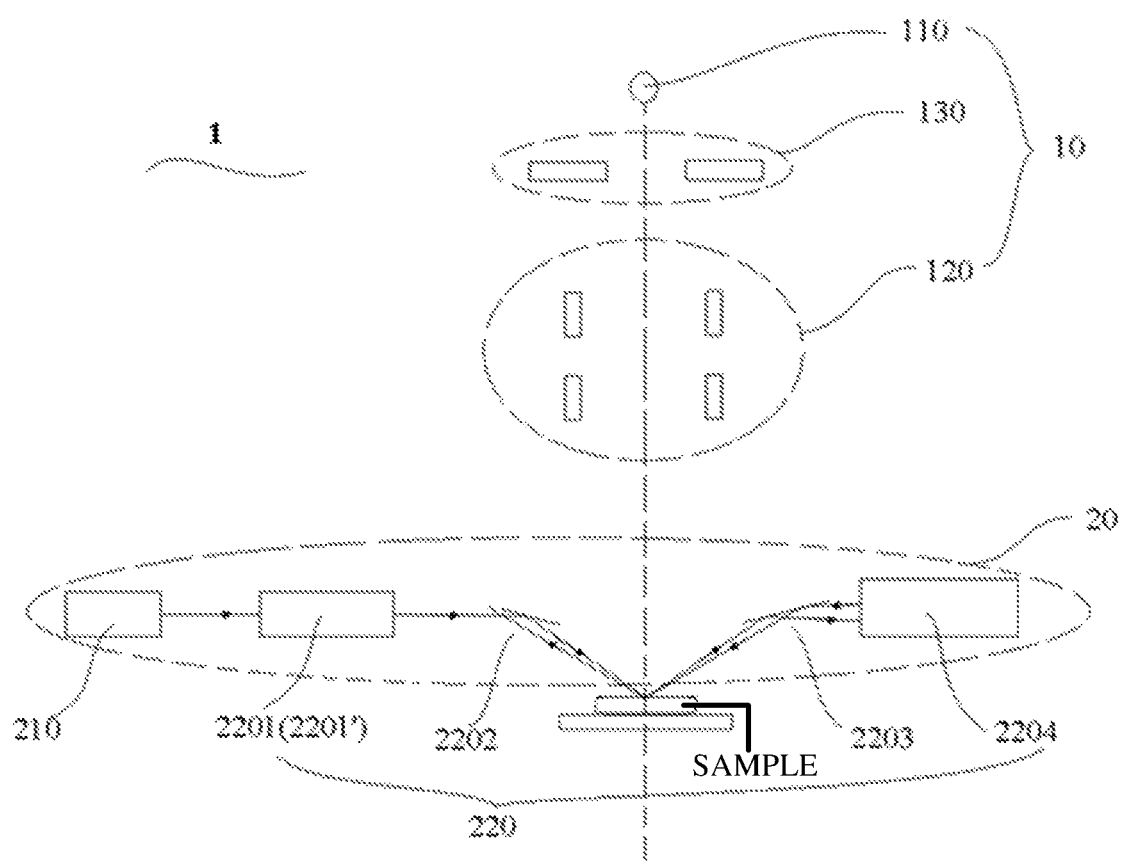
FIG. 2 is a structure diagram of the EBI apparatus as shown in FIG. 1.

FIG. 1 is a diagram of an example EBI apparatus according to implementations of this disclosure. FIG. 2 is a structure diagram of the EBI apparatus as shown in FIG. 1.

As shown in FIGS. 1 and 2, a laser-assisted EBI apparatus 1 for defect inspection of a test sample of a semiconductor device includes an EBI device 10 serving as a main component and a laser illumination device 20 serving as an auxiliary component. The semiconductor device can include a silicon wafer. The laser illumination device 20 can use a laser to illuminate a surface of the test sample (i.e., a test surface) to cause the photovoltaic effect. Specifically, the EBI device 10 includes an e-beam source 110 configured to emit an incident e-beam (or "e-beam" for simplicity), a deflector 120 configured to deflect the incident e-beam to project the same onto the test surface of the semiconductor device, and an electron detector 130 configured to detect emergent electrons (e.g., backscattered electrons and secondary electrons) generated by the projection of the incident e-beam onto the test surface. Moreover, the laser illumination device 20 includes a laser source 210 configured to generate a laser, and a guiding device 220 configured to guide the laser to be projected onto the semiconductor device. The laser projected onto PN junctions of the semiconductor device can change the emergent electrons by the electric potential caused by the photovoltaic effect. Under a normal working state of the electron detector, a PN junction of a PMOS in a CMOS of the semiconductor device is in a forward bias state, and a PN junction of an NMOS of the CMOS is in a conduction state due to being short-circuited by the photovoltaic effect. Therefore, under the normal working state of the electron detector, it can be simultaneously detected whether an open-circuit defect exists in respective metal contact holes corresponding to the PMOS and the NMOS.

As shown in FIG. 1, arrows in FIG. 1 indicate laser beams obliquely incident from the outside of the EBI apparatus toward the test surface. As shown in FIG. 1, the laser illumination device 20 can be entirely included in an integral structure of the EBI apparatus, such as, inside a cavity of a system that produces the e-beam. In other words, an internal light-path design is employed, thereby enabling the laser beam to be incident on the test surface inside the EBI apparatus at a smaller angle. According to the Fresnel formula, when the incident angle of the beam is small, the reflectivity is low, and the semiconductor device (e.g., a silicon wafer) can absorb more optical energy, by which the photovoltaic effect can be caused more easily, and the utilization of optical energy can be improved.

As shown in FIG. 2, the guiding device 220 includes a beam shaper 2201 (or 2201', see FIG. 4) and a first reflector 2202. The beam shaper 2201 (2201') can be configured to shape the laser to form a laser spot that is uniform and in a predetermined shape. The first reflector 2202 can be located downstream the beam shaper 2201 (2201') and configured to receive the shaped laser and reflect it to the test surface in a predetermined range of angles.

In some implementations, as shown in FIG. 2, the guiding device 220 can include the beam shaper 2201 (2201') configured to shape the laser to form the laser spot that is uniform and in the predetermined shape. In some implementations, the first reflector 2202 can have an angle relative to the test surface and an optical axis of the beam shaper 2201 (2201'). The first reflector 2202 can be configured to receive the shaped laser and reflect it to the test surface in a predetermined range of angles. For example, based on a geometrical optical relationship, when the optical axis of the laser emitted by the laser source is horizontal, the first reflector 2202 can be a planar mirror obliquely arranged with respect to the horizontal direction or a concave mirror. If the first reflector 2202 is the planar mirror that has a tilt angle θ with respect to the horizontal direction, based on the geometrical optical relationship, an incident angle of the laser formed on the first reflector 2202 in the form of the planar mirror is $\beta=90°-\theta$, and an incident angle of the laser incoming toward the horizontal test surface after reflection by the first reflector 2202 is $\alpha=90°-2\theta$. Thus, the larger the tilt angle θ with respect to the horizontal direction is, the smaller the incident angle α (at the test sample) of the laser is, and the lower reflectivity of the laser is at the incident location—that is, the more optical energy is absorbed by the semiconductor device (e.g., the silicon wafer). In this way, the photovoltaic effect can be caused more easily, and the utilization of the optical energy can be improved.

By shaping the laser beam incident on the test sample, uniformity of illumination of the laser spot formed by the laser beam on the test sample can be enhanced, and deformation of the laser spot caused by the oblique incidence of the laser beam toward the test sample can be improved. Furthermore, the optical energy in a unit illumination area can be increased, thereby increasing the utilization of optical energy.

In some implementations, as shown in FIG. 2, the guiding device 220 can further include an optical retroreflector 2204 and a second reflector 2203. The optical retroreflector 2204 can be configured to receive an emergent laser from the test surface and reflect it back. The reflected laser can be referred to as a retroreflected laser. The second reflector 2203 can be disposed between the test surface and the optical retroreflector 2204. The second reflector 2203 can be configured to reflect emergent laser from the test surface toward the optical retroreflector 2204 and reflect the retroreflected laser from the optical retroreflector 2204 toward the test surface.

For example, the second reflector 2203 can be used to receive the emergent beam reflected from the test surface and project the retroreflected laser onto the same effective position of the test surface at a different angle. For another example, the second reflector 2203 can be arranged such that the retroreflected laser projected onto the test surface is not reflected toward the laser source 210, thereby minimizing interference between the incident laser and the retroreflected laser.

By additionally providing the optical retroreflector 2204 downstream the test sample in the laser illumination device 20 of the EBI apparatus 1, a retroreflection path of the laser can be formed, thereby the energy of the reflected laser can be reused, and the utilization of the optical energy can be increased.

Figure 3:
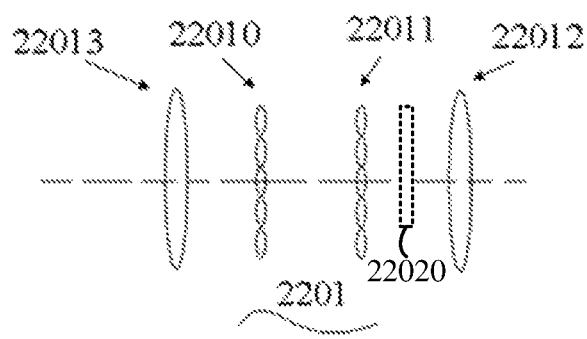
FIG. 3 is a structure diagram of an example beam shaper in the EBI apparatus as shown in FIGS. 1 and 2.

FIG. 3 is a structure diagram of the beam shaper 2201 in the EBI apparatus 1 as shown in FIGS. 1 and 2.

In some implementations, as shown in FIG. 3, the beam shaper 2201 includes a first microlens array 22010, and the first microlens array 22010 can include multiple microlenses arranged in the plane (e.g., the vertical plane shown in FIG. 3) orthogonal to an optical axis (e.g., the horizontal direction shown in FIG. 3) of the laser emitted by the laser source 210. The first microlens array 22010 can be configured to uniformize the laser—that is, to divide the laser beam incident thereon into multiple uniformized sub-beams.

Further, for example, as shown in FIG. 3, the beam shaper 2201 can include a second microlens array 22011. The second microlens array 22011 can also include multiple microlenses arranged in the plane (e.g., the vertical plane shown in FIG. 3) orthogonal to the optical axis (e.g., the horizontal direction shown in FIG. 3) of the laser emitted by the laser source 210. The second microlens array 22011 can be disposed downstream the first microlens array 22010 and configured to function as a field lens for deflecting the light path to increase incidence of edge beams of the laser, increase incident flux, and further uniformize the laser.

Further, for example, as shown in FIG. 3, the beam shaper 2201 can include a first lens 22012 that can function as a focus lens. The first lens 22012 can be disposed between the second microlens array 22011 and the first reflector 2202. The first lens 22012 can also be disposed between the first reflector 2202 and the test sample. The first lens 22012 can converge the sub-beams of the laser shaped by the first microlens array 22010 and the second microlens array 22011 as a combined beam toward the test surface.

For example, the first lens can be a Fourier lens and configured to change the laser spot from the beam shaper to be of a predetermined size on a rear focal plane of the Fourier lens.

Further, for example, as shown in FIG. 3, the beam shaper 2201 can include a collimating lens 22013 disposed between the laser source 210 and the first microlens array 22011. The collimating lens 22013 can be configured to collimate the laser incident into the beam shaper 2201 from the laser source 210. After being collimated by the collimating lens 22013, the output beam spot can be, for example, in an elliptical shape. The output beam spot can be further modified by the first microlens array 22010 and the first reflector 2202 to change the light spot incident onto the test sample into a predetermined shape (e.g., a square or a circle).

In some implementations, the guiding device 220 can further include a scattering piece 22020, which is shown using dotted lines to indicate that the scattering piece 22020 is an optional component. The scattering piece can be disposed between the second microlens array 22011 and the first lens 22012. The scattering piece can be used to diverge and expand the sub-beams shaped by the first microlens array 22010 and the second microlens array 22011 to a sufficient extent before the sub-beams entering the first lens 22012 and being converged by the same, thereby facilitate subsequent mixing of the sub-beams.

According to the above implementations, by shaping and uniformizing the laser based on one or more microlens arrays, an energy distribution of the laser spot of the shaped laser projected toward the first reflector 2202 and converged on the test surface can be close to a flat top distribution, thereby making the laser beam uniform and the energy distribution thereof even. Therefore, the photovoltaic effect in the effective illumination region on the test sample caused by the laser can also be uniform, and it is convenient to simultaneously detect whether an open-circuit connection defect exists in respective metal contact holes corresponding to the PMOS and the NMOS in the entire effective illumination region.

Figure 4:
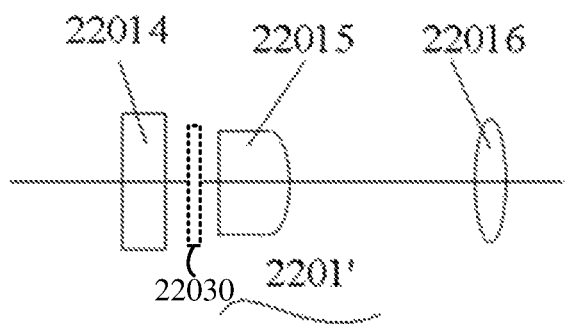
FIG. 4 is a structure diagram of another example beam shaper in the EBI apparatus as shown in FIGS. 1 and 2.

FIG. 4 is a structure diagram of the beam shaper 2201' in the EBI apparatus 1 as shown in FIGS. 1 and 2.

In some implementations, as shown in FIG. 4, for example, the beam shaper 2201' can include a pair of cylindrical lenses. The pair of cylindrical lenses can be coaxially disposed and configured to uniformize the laser. For example, the pair of cylindrical lenses can be orthogonal.

For example, FIG. 4 shows a pair (e.g., two) of cylindrical lenses. An upstream cylindrical lens 22014 can be configured to collimate the laser beam in the y-axis direction. A downstream cylindrical lens 22015 can be configured to collimate the laser beam in the x-axis direction. Alternatively, the upstream cylindrical lens 22014 can be configured to collimate the laser beam in the x-axis direction, and the downstream cylindrical lens 22015 can be configured to collimate the laser beam in the y-axis direction. In other words, the upstream cylindrical lens 22014 and the downstream cylindrical lens 22015 are orthogonally arranged or oriented.

In some implementations, the beam shaper 2201' can further include a first lens 22016 disposed between the pair of cylindrical lenses (e.g., the upstream cylindrical lens 22014 and the downstream cylindrical lens 22015) and the test surface. The first lens 22016 can converge the shaped laser toward the test surface. The first lens 22016 can also be disposed between the first reflector 2202 and the test sample.

In the above implementations, the laser source 210, the upstream cylindrical lens 22014, the downstream cylindrical lens 22015, the first lens 22016, and the first reflector 2202 can be configured to cooperate to make the spot incident on the test sample into any predetermined shape (e.g., a circle, a rectangular, or an oval).

In some implementations, the guiding device 220 can further include a scattering piece 22030, which is not shown using dotted lines to indicate that the scattering piece 22030 is an optional component. The scattering piece can be disposed between the pair of cylindrical lenses (e.g., the upstream cylindrical lens 22014 and the downstream cylindrical lens 22015) and the first lens 22016. The scattering piece can be used to diverge and expand the sub-beams shaped by the pair of cylindrical lenses to a sufficient extent before the sub-beams entering the first lens 22016, thereby facilitate subsequent mixing of the sub-beams.

According to the above implementations, by shaping the laser using one or more pairs (e.g., one pair, or two) of cylindrical lenses arranged orthogonally to each other, the adjustment of the spot shape can be more flexible.

In some implementations, the beam shaper can also include at least one of a light-uniformizing plate and a compound-eye lens.

Figure 5:
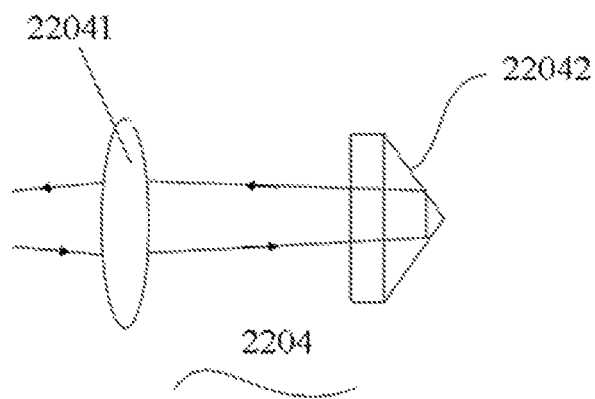
FIG. 5 is a structure diagram of an example optical retroreflector in the EBI apparatus as shown in FIGS. 1 and 2.

FIG. 5 is a structure diagram of an example optical retroreflector in EBI apparatus 1 as shown in FIGS. 1 and 2.

In some implementations, the optical retroreflector 2204 includes a prism 22042 and a second lens 22041. For example, the prism 22042 can include a pyramid prism. In some implementations, the prism 22042 can be replaced by a combination of multiple mirrors connected in certain angles that forms a semi-closed shape (e.g., a pyramid shape, a cone shape, or a hollow corner cube). For example, the prism 22042 can be replaced by a hollow corner cube made by a mirror group. The second lens 22041 can be disposed between the second reflector 2203 and the prism 22042. The second lens 22041 can also be disposed between the second reflector 2203 and the test sample. The prism 22042 can be configured to change a position and an incident angle of the emergent laser that is reflected from the second reflector 2203 and transmits through the second lens 22041, and then transmits the laser back through the second lens 22041 toward the second reflector 2203. The second lens 22041 can be configured to converge the emergent laser reflected by the second reflector 2203 toward the optical retroreflector 2204 to the prism 22042. In other words, in the optical retroreflector 2204, the second lens 22041 can focus a divergent reflected laser beam into a parallel beam to be incident on the prism 22042 and converge the laser beam reflected by the prism 22042. The prism 22042 can reflect the laser beam to the other side of the optical axis of the second lens 22041 by changing the position and the incident angle of the light beam.

In some implementations, the prism 22042 can be configured to be symmetric about its optical axis and disposed coaxially with the second lens 22041. The prism 22042 can be configured to reflect the emergent laser reflected thereto from the second reflector 2203, symmetrically about its optical axis, back toward the second reflector 2203.

In some implementations, the prism 22042 can also be replaced, for example, by a mirror group, such as a hollow corner cube.

Therefore, according to the above implementations, a retroreflective light path can be added to the laser path to utilize optical energy of the reflected laser, thereby increasing utilization of the laser energy.

In some implementations, the laser to be projected toward the semiconductor device can be projected onto a surface (referred to as a "measurement surface") of the test sample to be scanned by the e-beam.

According to implementations of this disclosure, the photovoltaic effect can be induced by projecting the laser to the test sample. However, the surface on the test sample where the laser beam is projected is not necessarily limited to be the measurement surface. Alternatively, the laser projected onto the semiconductor device can be projected onto a surface deviated from the measurement surface of the semiconductor device, and the wavelength of the laser can be selected such that the laser penetrates with a sufficient depth within the semiconductor device to induce the photovoltaic effect on the PN junctions near the measurement surface.

Further, in some implementations, the emergent electrons detected by the electron detector 130 of the EBI device can include at least one type of secondary electrons and back-scattered electrons. The secondary electrons can be generated by projecting the incident e-beam onto the test sample.

The implementations of this disclosure can be summarized as follows.

(1) The laser illumination device 20 of this disclosure is located inside the cavity of the EBI apparatus 1, whereby the angle incident on the sample can be smaller, the silicon wafer can absorb more optical energy, the photoelectric effect can be more easily induced, and the utilization of optical energy can be improved.

(2) The laser illumination device 20 of this disclosure can consist of a laser source 210 and a guiding device 220. The guiding device 220 can include a beam shaper 2201 (2201'), a first reflector 2202, a second reflector 2203, and an optical retroreflector 2204. The test sample can be located between the first reflector 2202 and the second reflector 2203.

(3) The laser illumination device 20 of this disclosure can use the beam shaper 2201 (2201') to shape the incident laser beam to achieve the purpose of forming the shape of the laser spot on the test sample to be a predetermined shape.

(4) The laser illumination device 20 of this disclosure can use an optical retroreflector 2204 to achieve further utilization of the optical energy of the retroreflected laser, which can improve the utilization of optical energy.

(5) The microlens array-based beam shaper 2201 of the laser illumination device 20 of this disclosure can utilize a microlens array-based light-uniformizing system, which can improve the uniformity of laser illumination and the utilization of optical energy.

(6) For the microlens array-based beam shaper 2201 of the laser illumination device 20 of this disclosure, different forms of the microlens arrays can cause different shapes of the laser spot, which can facilitate the setting of the laser spot.

(7) For the cylindrical lens-based beam shaper 2201' of the laser illumination device 20 of this disclosure, focal lengths and a distance between the cylindrical lenses can cause different shapes of the laser spot, which can facilitate the setting of the laser spot.

The benefits of the implementations of this disclosure can be summarized as follows.

This disclosure proposes a method for improving the optical energy utilization and illumination uniformity of laser illumination for inducing a photovoltaic effect in a semiconductor sample during e-beam based defect detection. By designing a specific optical path for beam shaping, the method can alleviate the problem of spot deformation caused by oblique incidence and improve the optical energy in the illumination area. Also, a specific retroreflection path is added to the specific optical path to utilize the optical energy of the reflected laser, which can facilitate fully using the laser energy. Compared with other technical solutions, this disclosure uses a design using an internal optical path. That is, the optical path is entirely located within the cavity of the EBI apparatus, by which the laser beam can be incident on the silicon wafer at a small incident angle. According to the Fresnel formula, when the incident angle of the laser is small, the reflectivity can be low, and the silicon wafer can absorb more optical energy to induce the photovoltaic effect. Two beam shaping solutions are proposed by the implementations of this disclosure. One solution is to use a microlens array for uniformization and light shaping, in which the energy distribution of the laser spot is close to the flat top distribution, and the energy uniformity in the laser spot can be further improved. The other solution is to use two vertically-arranged cylindrical lenses for beam shaping, in which the adjustment of the spot shape can be more flexible.

In another aspect of this disclosure, a laser-assisted e-beam detection method for a semiconductor device is provided. The method can use the aforementioned EBI apparatus to, under the normal working state of the electron detector, simultaneously detects whether an open-circuit defect exists in respective metal contact holes corresponding to the PMOS and the NMOS. The specific content and corresponding technical effects will not be further described hereinafter.

In addition, according to implementations herein, it should be understood that any technical solution as any combination of any two or more of the implementations also falls within the scope of the present disclosure.

It should be understood that orientation terms, such as "up," "down," "left," "right," and other similar terms, are used to explain the orientation relationship shown in the drawings. These orientation terms are not to be construed as limiting the scope of this disclosure.

The implementations of this disclosure are described in a progressive manner. Description of each implementation focuses on differences from other implementations. The same or similar parts between implementations can be referred to each other.

The word "example" is used herein to mean serving as an example, instance, or illustration. Any aspect or design described herein as "example" is not necessarily to be construed as preferred or advantageous over other aspects or designs. Rather, use of the word "example" is intended to present concepts in a concrete fashion. As used in this disclosure, the term "or" is intended to mean an inclusive "or" rather than an exclusive "or" for two or more elements it conjoins. That is, unless specified otherwise, or clear from context, "X includes A or B" is intended to mean any of the natural inclusive permutations. In other words, if X includes A; X includes B; or X includes both A and B, then "X includes A or B" is satisfied under any of the foregoing instances. The term "and/or" used in this disclosure is intended to mean an "and" or an inclusive "or." That is, unless specified otherwise, or clear from context, "X includes A, B, and/or C" is intended to mean X can include any combinations of A, B, and C. In other words, if X includes A; X includes B; X includes C; X includes both A and B; X includes both B and C; X includes both A and C; or X includes all A, B, and C, then "X includes A and/or B" is satisfied under any of the foregoing instances. Similarly, "X includes at least one of A, B, and C" is intended to be used as an equivalent of "X includes A, B, and/or C." In addition, the articles "a" and "an" as used in this application and the appended claims should generally be construed to mean "one or more" unless specified otherwise or clear from context to be directed to a singular form. Moreover, use of the term "an aspect" or "one aspect" throughout is not intended to mean the same implementation or aspect unless described as such.

The use of "including" or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The use of the terms "a" and "an" and "the" and similar referents in the context of describing the disclosure (especially in the context of the following claims) should be construed to cover both the singular and the plural. Furthermore, recitation of ranges of values herein is merely intended to serve as a shorthand method of referring individually to each separate value falling within the range, unless otherwise indicated herein, and each separate value is incorporated into the specification as if it were individually recited herein. Finally, the operations of all methods described herein are performable in any suitable order unless otherwise indicated herein or otherwise clearly contradicted by context. The use of any and all examples, or exemplary language (e.g., "such as") provided herein, is intended merely to better illuminate the disclosure, and does not pose a limitation on the scope of the disclosure unless otherwise claimed.

It should be understood that although this disclosure uses terms such as first, second, third, etc., the disclosure should not be limited to these terms. These terms are used only to distinguish similar types of information from each other. For example, without departing from the scope of this disclosure, a first information can also be referred to as a second information; and similarly, a second information can also be referred to as a first information. Depending on the context, the words "if" as used herein can be interpreted as "when," "while," or "in response to."

While the disclosure has been described in connection with certain implementations, it is to be understood that the disclosure is not to be limited to the disclosed implementations but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. An apparatus for laser-assisted electron-beam inspection, comprising:
   an electron-beam (e-beam) inspection device, comprising:
      an e-beam source, configured to emit an incident e-beam;
      a deflector, configured to deflect the incident e-beam to be projected onto a surface of a semiconductor device; and
      an electron detector, configured to detect emergent electrons generated by the incident e-beam projected onto the surface; and
   a laser illumination device, comprising:
      a laser source, configured to generate a laser; and
      a guiding device, configured to guide the laser to be projected onto the semiconductor device, wherein the laser changes the emergent electrons by a photovoltaic effect to cause, in a positive mode of the EBI apparatus, a PN junction of an N-type metal-oxide semiconductor (NMOS) of the semiconductor device to be in a conduction state, the guide device comprising:
         a beam shaper, configured to shape the laser as a shaped laser to form a laser spot, wherein the laser spot is uniform and in a predetermined shape; and
         a first reflector, arranged downstream the beam shaper and configured to reflect the shaped laser to the surface in a predetermined range of angles.

2. The apparatus of claim 1, wherein the guiding device further comprises:
   an optical retroreflector, configured to retroreflect an emergent laser from the surface to form a retroreflected laser; and
   a second reflector, arranged between the surface and the optical retroreflector, and configured to reflect the emergent laser toward the optical retroreflector, and reflect the retroreflected laser toward the surface.

3. The apparatus of claim 2, wherein the optical retroreflector comprises:
   a pyramid prism; and
   a second lens, arranged between the second reflector and the pyramid prism, wherein
      the pyramid prism is configured to change a position and an incident angle of the emergent laser reflected off the second reflector through the second lens to retroreflect the emergent laser through the second lens back to the second reflector; and
      the second lens is configured to converge the emergent laser reflected off the second reflector toward the pyramid prism.

4. The apparatus of claim 3, wherein the pyramid prism is shaped to be symmetrical about an optical axis of the pyramid prism and arranged to be coaxial with the second lens, and the pyramid prism is configured to retroreflect, symmetrically about the optical axis of the pyramid prism, the emergent laser reflected off the second reflector back to the second reflector.

5. The apparatus of claim 2, wherein the optical retroreflector comprises:
   a hollow corner cube made by a mirror group; and
   a second lens, arranged between the second reflector and the hollow corner cube, wherein
      the hollow corner cube is configured to change a position and an incident angle of the emergent laser reflected off the second reflector through the second lens to retroreflect the emergent laser through the second lens back to the second reflector; and
      the second lens is configured to converge the emergent laser reflected off the second reflector toward the hollow corner cube.

6. The apparatus of claim 1, wherein the beam shaper comprises:
   a first microlens array configured to uniformize the laser, comprising multiple microlenses arranged in a plane orthogonal to an optical axis of the laser.

7. The apparatus of claim 6, wherein the beam shaper further comprises:
   a second microlens array, comprising multiple microlenses arranged in the plane orthogonal to the optical axis of the laser, arranged downstream the first microlens array, and configured to function as a field lens.

8. The apparatus of claim 7, wherein the beam shaper further comprises:
   a first lens, arranged between the second microlens array and the first reflector, and configured to converge the shaped laser toward the test surface.

9. The apparatus of claim 8, wherein the guiding device further comprises:
   a scattering piece, arranged between the second microlens array and the first lens.

10. The apparatus of claim 8, wherein the first lens is a Fourier lens configured to change the laser spot to be of a predetermined size on a rear focal plane of the Fourier lens.

11. The apparatus of claim 6, wherein the beam shaper comprises:
    a collimating lens configured to collimate the laser, arranged between the laser source and the first microlens array.

12. The apparatus of claim 1, wherein the beam shaper comprises:
    a pair of cylindrical lenses, arranged coaxially and configured to uniformize the laser.

13. The apparatus of claim 12, wherein the pair of cylindrical lenses are orthogonal.

14. The apparatus of claim 13, wherein the beam shaper further comprises:
    a first lens, arranged between the pair of cylindrical lenses and the first reflector, and configured to converge the shaped laser toward the test surface.

15. The apparatus of claim 14, wherein the guiding device further comprises:
    a scattering piece, arranged between the pair of cylindrical lenses and the first lens.

16. The apparatus of claim 1, wherein the beam shaper comprises at least one of a light-uniformizing plate and a compound-eye lens.

17. A method for laser-assisted electron-beam inspection (EBI), comprising:
- configuring an EBI device of an apparatus to be in a positive mode;
- emitting, using an e-beam source of the EBI device, an incident e-beam;
- deflecting, using a deflector of the EBI device, the incident e-beam to be projected to a surface of a semiconductor device;
- detecting, with an electron detector of the EBI device, emergent electrons generated by the incident e-beam projected onto the surface of the semiconductor device;
- generating, using a laser illumination device of the apparatus, a laser;
- guiding, using a guiding device of the laser illumination device, the laser to be projected to the semiconductor device, wherein the laser changes the emergent electrons to cause a PN junction of the NMOS to be in a conduction state; and
- detecting, using the apparatus in a simultaneous manner, whether an open-circuit defect exist in a metal contact hole corresponding to a P-type metal-oxide semiconductor (PMOS) of a semiconductor device or a metal contact hole corresponding to an N-type metal-oxide semiconductor (NMOS) of the semiconductor device.

* * * * *